(12) United States Patent
Lenssen et al.

(10) Patent No.: US 6,661,071 B2
(45) Date of Patent: Dec. 9, 2003

(54) MEMORY HAVING PLURAL MAGNETIC LAYERS AND A SHIELDING LAYER

(75) Inventors: Kars-Michiel Hubert Lenssen, Eindhoven (NL); Jacobus Josephus Maria Ruigrok, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/886,184

(22) Filed: Jun. 21, 2001

(65) Prior Publication Data

US 2002/0008988 A1 Jan. 24, 2002

(30) Foreign Application Priority Data

Jun. 23, 2000 (EP) .............................. 00202187

(51) Int. Cl.[7] .............................................. H01L 29/82
(52) U.S. Cl. ........................ 257/422; 257/414; 257/421
(58) Field of Search ................................ 257/414, 421, 257/422, 427; 365/157, 158, 171, 173

(56) References Cited

U.S. PATENT DOCUMENTS

| 3,708,789 | A | * | 1/1973 | Spain |
|---|---|---|---|---|
| 5,569,544 | A | * | 10/1996 | Daughton |
| 5,831,920 | A | * | 11/1998 | Chen et al. |
| 5,902,690 | A | | 5/1999 | Tracy et al. ................ 428/693 |
| 5,940,319 | A | * | 8/1999 | Durlam et al. |
| 6,197,456 | B1 | * | 3/2001 | Aleshi et al. |

FOREIGN PATENT DOCUMENTS

| EP | 0776011 A2 | 11/1996 |
|---|---|---|
| WO | 0072324 A1 | 5/2000 |

OTHER PUBLICATIONS

Wolf, "Silicon Processing for the VLSI Era, vol. 2–Process Integration," 1990, Lattice Press, vol. 2, p. 567.*

* cited by examiner

Primary Examiner—Nathan J. Flynn
Assistant Examiner—Kevin Quinto
(74) Attorney, Agent, or Firm—Steven R. Biren

(57) ABSTRACT

The object of the invention is the shielding of a magnetic memory against high external magnetic fields. The magnetic memory (1) comprises an array of magnetic memory elements (2), each memory element (3) including at least one layer of magnetic material (4). The operation of the magnetic memory elements (3) is based on a magnetoresistance effect. The memory (1) is protected against high external magnetic fields by a shielding layer (14), which has been split into regions (5) covering the memory elements (3). The magnetic memory (1) is not erased by high external magnetic fields because of a strong attenuation of the external magnetic field by the regions (5) of the shielding layer (14).

17 Claims, 2 Drawing Sheets

MEMORY HAVING PLURAL MAGNETIC LAYERS AND A SHIELDING LAYER

The invention relates to a magnetic memory comprising an array of magnetic memory elements, each memory element including at least one layer of a magnetic material, said memory being provided with a shielding layer against magnetic fields.

Such a magnetic memory is disclosed in U.S. Pat. No. 5,902,690.

Magnetic memories may take the place of SRAM, DRAM, FLASH and non-volatile memories, such as EPROM and EEPROM owing to the short read and write times, the non-volatile memory and the comparatively low power dissipation. The operation of the magnetic memory elements is based on a magnetoresistance effect, which means that a magnetic field determines the direction of magnetization of the magnetic material, and, when an electric current is sent through the material, the electric resistance depends upon the orientation of the magnetization of the magnetic material. By means of a magnetic field, the direction of magnetization can be switched to two states.

One magnetization state corresponds to a comparatively low resistance, a 0, the other state corresponds to a comparatively high resistance, a 1. By directing the magnetization in each memory element by means of a local magnetic field, the memory can be written. External magnetic fields can erase the memory when the magnetic field changes the orientation of the direction of magnetization. Shielding against magnetic disturbing fields is necessary.

In the known memory, the material of the shielding layer is an electrically non-conducting ferrite.

A drawback of the known shielding layer resides in that comparatively strong magnetic disturbing fields of, for example, several tens of kA/m cannot be stopped completely because the ferrite shielding layer becomes magnetically saturated. Once the shielding layer is magnetically saturated, the magnetic field penetrates through the shielding layer, as a result of which the stored magnetization direction in the memory elements can flip over and the non-volatile memory may be erased. Weak magnetic fields of several kA/m are sufficient to erase memory elements.

In certain applications, for example smart cards, the magnetic memories must be protected against strong magnetic disturbing fields of at least 80 kA/m. Shielding against such strong, external magnetic fields is impossible with the known shielding layer.

Another drawback resides in that the known shielding layer must be thicker as the magnetic disturbing field is stronger. Magnetic memories are often provided on Si semiconductor substrates. In the semiconductor technology, thin-film technologies are employed to apply layers. Shielding layers whose thickness is above 10 $\mu$m are very expensive owing to the long deposition time.

It is an object of the invention to provide a magnetic memory of the type described in the opening paragraph, which is shielded against comparatively strong magnetic disturbing fields of several hundred kA/m.

In the magnetic memory in accordance with the invention, this object is achieved in that the shielding layer is split into mutually separated regions.

A magnetic layer becomes saturated as a result of a magnetic field of sufficient strength. As the shielding layer in the memory in accordance with the invention is split into mutually separated regions, the magnetic field can fan out between the regions. In the magnetic regions of the shielding layer, the magnetic field lines are drawn into the material. The density of the magnetic field lines in these regions is reduced with respect to a continuous layer, as a result of which saturation of the magnetization occurs less rapidly, so that a stronger magnetic field can be shielded than in the case of a continuous shielding layer of the same layer thickness.

Preferably, each memory element comprises, in addition to a first layer of a magnetic material, a second layer of a magnetic material, which is separated from said first layer of magnetic material by a non-magnetic material, because magnetoresistance effects occur in such memory elements which exceed the magnetoresistance effect that occurs in a memory element comprising a single layer of magnetic material.

Spin valves and magnetic tunnel junctions comprise such a layer packet and have the advantage that they can function as a magnetic memory element when the magnetic fields are weak. In its most basic form, a spin valve is a three-layer structure composed of a soft magnetic layer wherein the magnetization changes as a result of a comparatively weak magnetic field, a harder magnetic layer and a noble metal sandwiched therebetween. In a magnetic tunnel junction, the two magnetic layers are separated by an electrical insulation layer. As the magnetoresistance effect in spin valves and magnetic tunnel junctions is comparatively large, they can very suitably be used as a magnetic memory element.

The position of the regions of the shielding layer preferably is such that the perpendicular projection of a region on the memory elements comprises at least one memory element. When the dimensions of the memory elements lie in the submicron range, it is advantageous for the perpendicular projection of a region of the shielding layer on the memory elements to comprise a plurality of memory elements, so that the dimensions of the shielding regions can be readily realized and, in general, the shielding effect is also favorably influenced.

In order to provide sufficient shielding against a magnetic disturbing field at the location of the memory elements, two conditions must be met.

First, the magnetization of the material of the shielding layer must remain below the saturation value. Above the saturation value, the field penetrates the material. If the distance between the memory elements and the shielding layer is small, for example 0.5 or less, with respect to the dimensions $\underline{w}$ of the region, then the magnetization $\underline{M}$ is given by $M=H_{appl}\chi/(1+\chi t/w)$, wherein $\underline{H}_{appl}$ is the external magnetic disturbing field, $\chi$ is the magnetic susceptibility and $\underline{t}$ is the thickness of the shielding layer. The magnetic regions may be of arbitrary shape. In general, the regions will be, for example, rectangular, square, round or hexagonal. The dimensions w of a region then correspond to, respectively, a length and a width, a diameter or a diagonal. Sufficient shielding requires, in the first place, that the following equation is met $t/w > H_{appl}/M_s - 1/\chi$, wherein $\underline{M}_s$ is the saturation value of the magnetization. If this equation is not met, the shielding layer is subject to saturation.

At this stage, it can be readily understood that, owing to the fact that the shielding layer of thickness $\underline{t}$ is split into regions, the dimensions $\underline{w}$ of a region are much smaller than the dimensions w' of a continuous shielding layer extending throughout the surface of the magnetic memory, so that the magnetic disturbing fields can be approximately a factor of w'/w larger before saturation of the magnetization takes place and the magnetic fields are penetrated.

Consequently, as the shielding layer is divided into regions, it is also possible, with a view to shielding against a magnetic disturbing field, to choose the thickness of the shielding layer to be smaller than that of an undivided shielding layer.

Second, it is necessary for the regions of the shielding layer to sufficiently attenuate the magnetic disturbing field, so that the direction of magnetization in the memory elements cannot flip over. Below saturation, the magnetic field at the location of the magnetic memory element is given by $H=H_{appl}/(1+\chi t/w)$. The magnetic disturbing field $H_{appl}$ is attenuated to a much lower magnetic field H at the location of the magnetic memory element, if the following equation is met $t/w > H_{appl}/(H\chi)-1/\chi$.

Consequently, in order to sufficiently shield each memory element, the following equations must be met $t/w > H_{appl}/M_s - 1/\chi$ and $t/w > H_{appl}/(H\chi) - 1/\chi$. Consequently, it is favorable for the ratio t/w to be as large as possible.

An example: The magnetic disturbing field $H_{appl}$ of 100 kA/m is attenuated to a much lower magnetic field H of 1 kA/m at the location of the magnetic memory element if the following equation is met: $t/w > 100/(1*\chi)-1/\chi$.

Magnetic layers such as FeNi have a comparatively large susceptibility value of, for example, 1000. As a result, the ratio of the thickness of the shielding layer to the dimensions of each region is >0.1:1. It will be clear that the magnetic disturbing field is attenuated less as the t/w ratio is chosen to be smaller. Therefore, it is advantageous if t/w>0.01.

Favorably, the thickness of the shielding layer is much larger than the thickness of the magnetic memory element, for example a factor of 10, so as to ensure that the maximum number of magnetic flux lines of the external magnetic disturbing field pass through the shielding layer, not through the memory elements.

The material of the shielding layer has a magnetic susceptibility which is preferably as large as possible, for example in excess of 100. Preferably, the material also has a high magnetic saturation, for example in excess of 800 kA/m.

The magnetic regions influence the reading and writing of the magnetic memory. For reading and writing a magnetic memory element, a local magnetic field is generated by simultaneously sending a current through a word line and a bit line. The magnetic regions of the shielding layer concentrate the local magnetic field in a magnetic memory element. The word line, through which a comparatively large current is sent, is preferably situated between a region of the shielding layer and a magnetic memory element. As a result, the magnetic material of a region reduces the amount of current necessary for reading and writing a magnetic memory.

Magnetic memories may be integrated with a semiconductor IC. The IC may comprise a silicon substrate with semiconductor devices. Semiconductor devices are, for example, diodes, bipolar transistors or MOS transistors. In general, the magnetic memory is provided on the semiconductor devices. Said semiconductor devices are connected to the magnetic memory by means of metal tracks. The magnetic memory is capable of electrically communicating with an electronic circuit of semiconductor devices in the Si substrate. The operation of an electronic circuit may be adversely affected by parasitic capacitances. A continuous shielding layer of an electroconductive magnetic material in combination with the substrate results in a comparatively large parasitic capacitance. Said relatively large capacitance drastically limits the speed of the IC. As the shielding layer is split into regions, the total parasitic capacitance of the shielding layer is substantially reduced, and the operation of the circuit at high frequencies, for example in the GHz range, is improved.

An additional advantage is that the regions of the shielding layer can be arranged over the semiconductor IC in such a manner that semiconductor devices in the IC are shielded against UV light and radiation.

If the regions of the shielding layer are situated on top of an IC, said IC is better protected against identification by means of optical methods, owing to the fact that the regions of the shielding layer are not transparent. Besides, the material of the shielding regions is difficult to remove by means of, for example, etching methods, so that reverse engineering of chips is made much more difficult.

These and other aspects of the magnetic memory in accordance with the invention will be apparent from and elucidated with reference to the embodiment(s) described hereinafter.

In the drawings:

FIG. 1 diagrammatically shows an embodiment of the magnetic memory elements and the regions of the shielding layer;

Figure 1:
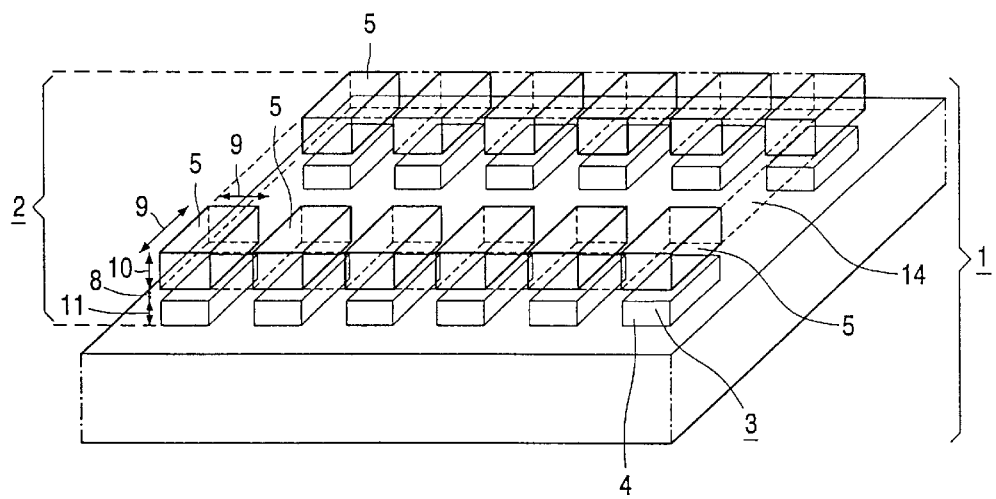

The magnetic memory 1 shown in FIG. 1 comprises an array of memory elements 2. Each memory element 3 comprises at least one layer of magnetic material 4.

In its most basic form, the operation of a memory element 3 is based on an anisotropic magnetoresistance effect (AMR) in a magnetic material.

An anisotropic magnetoresistance effect (AMR) occurs when the resistance in a magnetic conductor is determined by the angle between the current in the conductor and its magnetization. If the current and the magnetization are oriented in the same direction, then the resistance is highest; if the current and the magnetization extend at right angles to each other, then the resistance is lowest. The difference is typically two to four percent.

A memory element 3 operates better as the magnetoresistance effect is larger.

A giant magnetoresistance (GMR) effect is brought about by spin-dependent scattering in inhomogeneous magnetic systems, such as in a stack of magnetic and non-magnetic metallic layers. If the magnetizations of the individual magnetic layers are switched in one direction by the application of an external magnetic field, then a kind of short-circuit for the electrons with one specific spin direction occurs. As a result, if the magnetizations extend in parallel directions, the resistance is lower than in the case where the magnetizations are anti-parallel. As a result, the resistance in the multilayer may decrease phenomenally to typically approximately 40 to 60% at room temperature. The magnetic field necessary to break the spontaneous magnetic coupling is rather large though, typically several hundred kA/m.

Memory elements which are capable of operating at small magnetic fields are spin valves and magnetic tunnel junctions. A characteristic feature of these memory elements is that a second layer of magnetic material is separated from the first layer by a non-magnetic material.

A magnetic memory element may alternatively consist of a hybrid of a ferromagnetic and a semiconductor. The magnetic fringing field of the ferromagnet is sufficient to bring about a Hall effect in the semiconductor. The Hall voltage may be positive or negative, i.e. representing a 0 or a 1, respectively.

The shielding layer 14 of the magnetic memory is divided into mutually separated regions 5. The regions 5 may be arbitrarily shaped. The shielding regions 5 are preferably situated at the smallest possible distance 8 from the magnetic memory elements 3. A better shielding result is achieved by providing the shielding regions 5 on either side of the memory elements 3. In the embodiment in question, the dimensions of a shielding region 9 are such that the perpendicular projection of a magnetic shielding region 5 on the memory elements comprises one memory element 3. If the material of the magnetic shielding regions 5 is a good electrical insulator, as in the case of ferrites, the shielding regions 5 can be provided directly on the memory elements 3. If the material of the shielding regions 5 is electroconductive, preferably, a thin layer of an insulating material of, for example, $AlO_x$, $SiO_2$ or $Si_3N_4$ is provided between the magnetic memory elements 3 and the magnetic regions 5. In order to shield the memory elements 3 to the extent possible, the material of the regions 5 preferably exhibits a large susceptibility. A susceptibility value of 1000 can be achieved using, for example, NiFe, CoNbZr, FeSi, FeAlSi.

The regions 5 are of a thickness 10, which is generally much larger than the thickness of the magnetic memory element 11, so that the magnetic regions 5 function as a kind of short-circuit for the external magnetic disturbing field.

Figure 2:
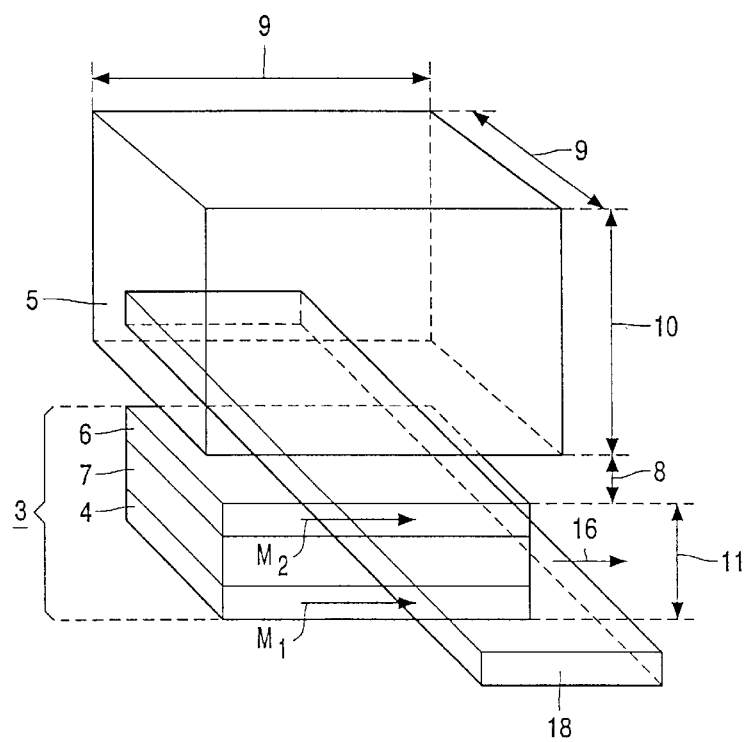
FIG. 2 shows a magnetic memory element comprising a spin valve and a configuration of a shielding region.

In FIG. 2, corresponding parts bear the same reference numerals as in FIG. 1. FIG. 2 shows a magnetic memory element 3 comprising a spin valve and a possible configuration of a shielding region 5.

In the embodiment shown, the spin valve 3 is a three-layer structure composed of a first hard magnetic layer 4 of, for example, CoFe, a second, softer magnetic layer 6 of, for example, NiFe which requires only a small magnetic field to change the magnetization, and a non-magnetic metal 7 of, for example, Cu sandwiched therebetween. Each layer is typically 1 to 10 nm thick. The magnetizations of the layers may be oriented so as to be parallel or anti-parallel with respect to each other. In this embodiment, the word line 18 and the bit line 16 serve to write the magnetization direction in the first layer 4 of a selected magnetic memory element 3 and to read the stored magnetization direction from the memory element 3. The word line 18 is situated between a magnetic region 5 and a magnetic memory element 3. Writing takes place by simultaneously sending a comparatively large current through the word line 18 and a current of, for example, 1 mA through the bit line 16, so that the magnetization of the first comparatively hard magnetic layer is directed. Reading of a bit, or in other words the determination of the magnetic orientation of the first layer 4, takes place using a sequence of current pulses having a smaller amplitude which are capable of switching the soft-magnetic layer 6, not the first hard magnetic layer 4. The resistance of the memory element 3 is measured by means of a sense current through the bit line 16 when a sequence of a positive and a negative current pulse is being sent through the word line 18. In this process, the local magnetic field is larger than the switching field of the second, soft-magnetic layer 6 and smaller than the switching field of the hard magnetic layer 4. The first pulse of the pulse sequence places the magnetization of the soft-magnetic layer 6 in a defined starting position. The sign of the resistance change during the second pulse indicates whether the information in the hard-magnetic layer 4 is a 0 or a 1. For a stored 0, the pulse sequence corresponds, for example, to an antiparallel-to-parallel orientation of the magnetization, with the electrical resistance changing from high to low. At room temperature, the resistance difference typically is 4 to 18%.

Figure 3:
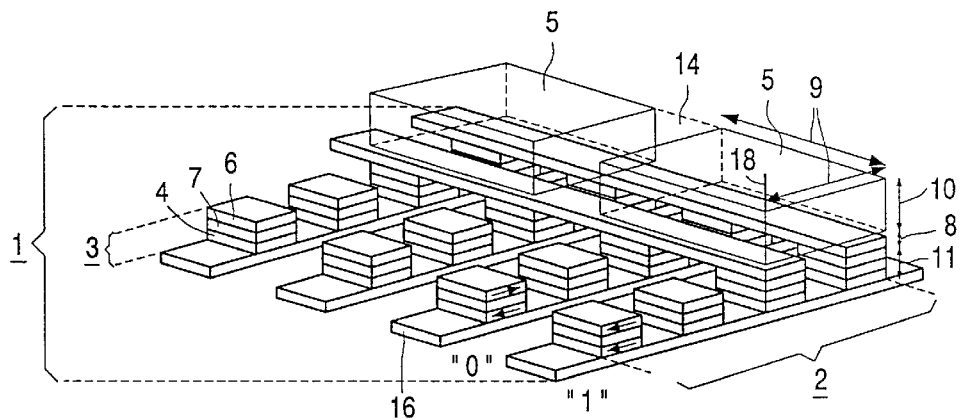
FIG. 3 shows an embodiment of a magnetic memory comprising an array of magnetic tunnel junctions.

In FIG. 3, corresponding parts bear the same reference numerals as in FIG. 1 and FIG. 2. FIG. 3 shows a possible embodiment of a magnetic memory 1 comprising an array 2 of magnetic tunnel junctions 3. In a magnetic tunnel junction 3, two ferromagnetic layers 4, 6 of, for example, CoFe having a thickness of several nanometers, are separated by an insulation layer 7. The insulation layer is 1 to 2 nm thick and is made, for example, from $Al_2O_3$. By applying a small voltage across the sandwich of magnetic layers comprising the metal oxide 7 between them, the electrons can tunnel through the insulation layer 7. The tunneling probability depends on the magnetic orientation of both magnetic layers 4, 6: the tunneling probability is larger if both magnetic orientations extend parallel to each other. The difference in electric resistance is typically 20–40% at room temperature. In the embodiment shown in FIG. 3, a shielding region 5 extends over four memory elements 3. The distance from the memory elements 3 to the shielding layer 14 is smaller than the dimensions of the region 9. In the magnetic shielding regions 5, saturation of the magnetization caused by the magnetic field must not take place.

Sufficient shielding requires $t/w > H_{appl}/M_s - 1/\chi$ and $t/w > (H_{appl}/H - 1)\chi^{-1}$. At practical values of $H_{appl}$ is 80 kA/m, the saturation value of the magnetization $M_s$=800 kA/m for NiFe and $\chi$=1000 and a magnetic field H=0.8 kA/m at the location of the magnetic memory elements 3, a value of $t/w > 0.1$ is achieved.

Figure 4:
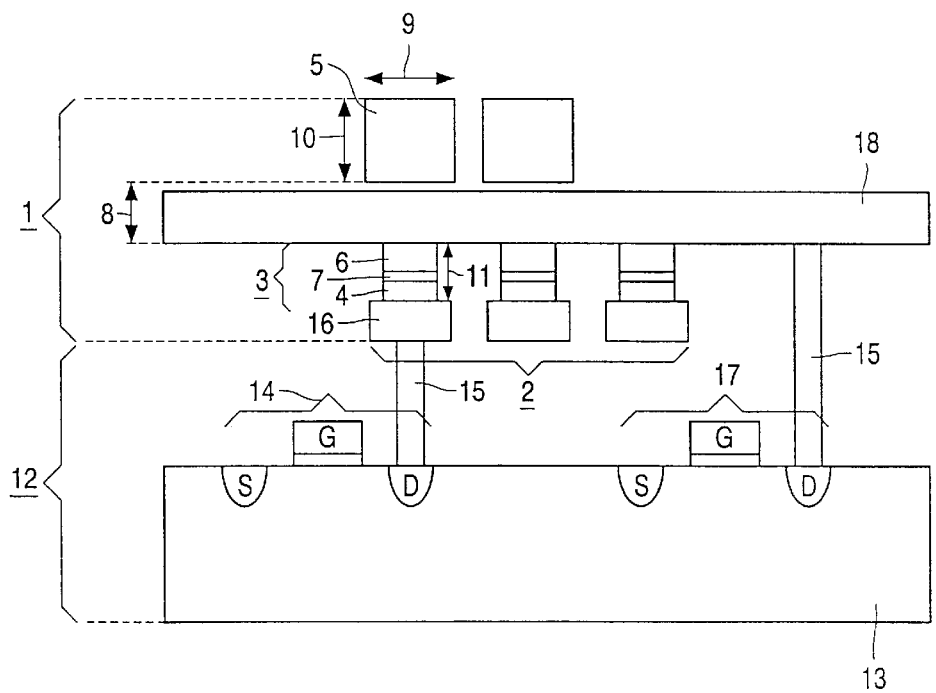
FIG. 4 is a diagrammatic, cross-sectional view of an embodiment of a magnetic memory integrated with a semiconductor IC.

In FIG. 4, corresponding parts bear the same reference numerals as in FIG. 1, FIG. 2 and FIG. 3. FIG. 4 is a diagrammatic, cross-sectional view of an embodiment of a magnetic memory 1 integrated with a semiconductor IC 12. The Si substrate 13 comprises semiconductor devices, for example diodes, bipolar transistors, MOS devices, or combinations thereof.

The magnetic memory 1 is arranged above the semiconductor devices and connected to said semiconductor devices by metal tracks 15. The semiconductor devices are capable of electronically switching the magnetic memory elements 3. In this embodiment, a MOS transistor 14 is connected to a bit line 16 of the magnetic memory 1. A second MOS transistor 17 selects the word line 18 of the magnetic memory 1. The magnetic memory 1 can be controlled by an electronic circuit manufactured in or on the Si substrate 13.

What is claimed is:

1. A magnetic memory (1) comprising an array of magnetic memory elements (2), each magnetic memory element (3) including two layers of magnetic material (4) separated by a non-magnetic material (7), said memory being provided with a shielding layer (14) for protecting said memory elements against magnetic fields, and said shielding layer (14) being split into mutual separated regions (5), wherein the thickness of the region (5) exceeds the thickness (11) of the magnetic memory elements by at least a factor of 10.

2. A magnetic memory (1) as claimed in claim 1, characterized in that a perpendicular projection of a region (5) covers at least one of the memory elements (2).

3. A magnetic memory (1) as claimed in claim 1, characterized in that the memory elements (3) are situated at a distance (8) from the shielding layer (14) which is smaller than dimensions (9) of the region (5).

4. A magnetic memory (1) as claimed in claim 1, characterized in that a ratio between a thickness (10) of a region (5) and dimensions (9) of the region (5) is >0.01.

5. A magnetic memory (1) as claimed in claim 1, characterized in that the magnetic memory is integrated with a semiconductor IC (12).

6. A magnetic memory (1) as claimed in claim 1, characterized in that the material of the regions (5) has a magnetic susceptibility above 100.

7. A magnetic memory (1) as claimed in claim 6, characterized in that the material of the regions (5) has a magnetic saturation value above 800 kA/m.

8. A magnetic memory (1) comprising an array of magnetic memory elements (2), each magnetic memory element (3) including two layers of magnetic material (4) separated by a non-magnetic material (7), said memory being provided with a shielding layer (14) for protecting said memory elements against magnetic fields, and said shielding layer (14) being split into mutual separated regions (5), each region having a thickness (10) and a length (9), a ratio of said thickness to said length being >0.1.

9. A magnetic memory (1) comprising an array of magnetic memory elements (2), each magnetic memory element (3) including two layers of magnetic material (4) separated by a non-magnetic material (7), said memory being provided with a shielding layer (14) for protecting said memory elements against magnetic fields, and said shielding layer (14) being split into mutual separated regions (5), and having a word line (18) situated between a region (5) and a memory element (3).

10. A magnetic memory (1) comprising an array of magnetic memory elements (2), each magnetic memory element (3) including at least a first layer of magnetic material (4), said memory being provided with a shielding layer (14) for protecting said memory elements against magnetic fields, said shielding layer being divided into mutually separated regions (5), characterized in that a ratio between a thickness of each region (5) and a dimension (9) of said each region is >0.1.

11. A magnetic memory (1) as claimed in claim 10, characterized in that each memory element (3) comprises a second layer of a magnetic material (6), which is separated from the first layer (4) by a non-magnetic material (7).

12. A magnetic memory (1) as claimed in claim 10, characterized in that a perpendicular projection of a region (5) covers at least one of the memory elements (2).

13. A magnetic memory (1) as claimed in claim 10, characterized in that the magnetic memory is integrated with a semiconductor IC (12).

14. A magnetic memory (1) as claimed in claim 12, characterized in that the memory elements (3) are situated at a distance (8) from the shielding layer (14) which is smaller than dimensions (9) of the region (5).

15. A magnetic memory (1) as claimed in claim 12, characterized in that a thickness (10) of the regions (5) exceeds a thickness (11) of the magnetic memory elements (3).

16. A magnetic memory (1) as claimed in claim 12, characterized in that the material of the regions (5) has a magnetic susceptibility above 100.

17. A magnetic memory (1) as claimed in claim 12, characterized in that the material of the regions (5) has a magnetic saturation value above 800 kA/m.

* * * * *